(12) United States Patent
Kim et al.

(10) Patent No.: US 10,504,467 B2
(45) Date of Patent: Dec. 10, 2019

(54) DISPLAY DEVICE AND MANUFACTURING METHOD THEREOF

(71) Applicant: Samsung Display Co., Ltd., Yongin-si (KR)

(72) Inventors: Yoon-Jang Kim, Seoul (KR); Kwi Hyun Kim, Yongin-si (KR); Sung Ryul Kim, Asan-si (KR); Yun Seok Lee, Seoul (KR); Wan-Soon Im, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 216 days.

(21) Appl. No.: 15/485,659

(22) Filed: Apr. 12, 2017

(65) Prior Publication Data

US 2017/0309242 A1 Oct. 26, 2017

(30) Foreign Application Priority Data

Apr. 20, 2016 (KR) ........................ 10-2016-0048117

(51) Int. Cl.
*G09G 3/36* (2006.01)
*H01L 27/32* (2006.01)
*G02F 1/1333* (2006.01)
*G02F 1/1362* (2006.01)
*G02F 1/1368* (2006.01)
(Continued)

(52) U.S. Cl.
CPC .......... *G09G 3/3677* (2013.01); *G02F 1/1368* (2013.01); *G02F 1/133345* (2013.01); *G02F 1/136209* (2013.01); *G02F 1/136286* (2013.01); *H01L 27/124* (2013.01); *H01L 27/1222* (2013.01); *H01L 27/1288* (2013.01); *H01L 27/3279* (2013.01); *H01L 29/66757* (2013.01); *H01L 29/66969* (2013.01); *H01L 29/7869* (2013.01); *H01L 29/78633* (2013.01); *H01L 29/78675* (2013.01); *G02F 1/13454* (2013.01); *G02F 2001/136295* (2013.01); *G02F 2201/123* (2013.01); *G02F 2202/104* (2013.01)

(58) Field of Classification Search
CPC .............. G09G 3/3677; G02F 1/13454; H01L 27/3279
See application file for complete search history.

(56) References Cited

U.S. PATENT DOCUMENTS

2012/0139881 A1* 6/2012 Kwon ................. G09G 3/3677
345/204
2014/0319527 A1 10/2014 Shin et al.

FOREIGN PATENT DOCUMENTS

| KR | 10-2007-0076791 | 7/2007 |
| KR | 10-2008-0010783 | 1/2008 |

(Continued)

*Primary Examiner* — Farun Lu
(74) *Attorney, Agent, or Firm* — H.C. Park & Associates, PLC

(57) ABSTRACT

A display device including a substrate, a gate driver disposed on the substrate and including a plurality of stages, a clock signal line disposed on the substrate, and transmitting a clock signal to at least one of the stages, a transistor disposed on the substrate, and a light blocking layer disposed between the substrate and the transistor and overlapping the transistor. The clock signal line includes a first conductive line and a second conductive line overlapping the first conductive line, and the first conductive line is disposed in the same layer as the light blocking layer.

11 Claims, 17 Drawing Sheets

(51) Int. Cl.
*H01L 27/12* (2006.01)
*H01L 29/66* (2006.01)
*H01L 29/786* (2006.01)
*G02F 1/1345* (2006.01)

(56) References Cited

FOREIGN PATENT DOCUMENTS

| KR | 10-2014-0129505 | 11/2014 |
| KR | 10-2015-0124925 | 11/2015 |

\* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2016-0048117, filed on Apr. 20, 2016, which is hereby incorporated by reference for all purposes as if fully set forth herein.

BACKGROUND

Field

The invention relates generally to a display device and a manufacturing method thereof, and, more particularly to a display device having clock signal lines in close proximity.

Discussion of the Background

Display devices such as a liquid crystal display and an organic light emitting device include driving devices such as a data driver and a gate driver. The gate driver may be integrated with a display panel. When the gate driver is integrated with the display panel, there is no need to manufacture an additional gate driving chip, so manufacturing costs are reduced and a defect that may occur while mounting the gate driving chip is prevented.

The gate driver integrated to the display panel includes a plurality of stages for generating gate signals including a gate-on voltage and a gate-off voltage, and may generate gate signals with various kinds of waveforms according to clock signals and carry signals input to the respective stages.

The clock signals are transmitted to the stage of the gate driver through clock signal lines, and an RC (resistive-capacitive) delay of the clock signal may be generated due to parasitic capacitance between the clock signal lines or between the signal lines that are adjacent to the clock signal lines.

The above information disclosed in this Background section is only for enhancement of understanding of the background of the inventive concepts, and therefore, it may contain information that does not form the prior art that is already known in this country to a person of ordinary skill in the art.

SUMMARY

Applicants discovered that the delay of clock signals on the liquid crystal panel may decrease the charging rate of pixels. The delay of clock signals becomes a main factor in decreasing the charging rate as the resolution or size of the liquid crystal panel becomes bigger. When the charging rate decreases, defects in image quality such as color mixing or crosstalk may occur.

Display devices constructed according to the principles of the invention improve display quality by reducing resistance of one or more clock signal lines. Reducing the resistance of a clock signal line in turn results in a reduction of parasitic capacitance between the clock signal lines or between the signal lines that are adjacent to the clock signal lines. And, reduction in that parasitic capacitance reduces or eliminates any undesirable delay in clock signals such that the clock signals are delivered more rapidly. Delivering the clock signals more rapidly improves the response time in forming images on the display.

According to exemplary embodiments of the invention, the clock signal lines may be provided as double layers by use of the conductive layer formed in the display area to thus reduce resistance of the clock signal line and improve the RC delay of the clock signals.

The margin of the charging rate may be improved by reducing the delay of clock signals through the reduction of resistance of clock signal lines according to the principles of the invention. As the margin of the charging rate increases, widths of the data lines or the gate lines of the pixel area may be reduced thereby improving transmittance. The width of the clock signal line may be reduced while maintaining or reducing the resistance of the clock signal line according to the inventive dual layer structure, so the peripheral area of the display panel occupied by the clock signal line may be reduced in addition to a reduction of the RC delay, thereby reducing the width of a bezel of the display device.

Additional aspects will be set forth in the detailed description which follows, and, in part, will be apparent from the disclosure, or may be learned by practice of the inventive concepts.

According to one aspect of the invention, a display device includes a substrate, a gate driver disposed on the substrate and including a plurality of stages, a clock signal line disposed on the substrate and transmitting a clock signal to at least one of the stages, a transistor disposed on the substrate, and a light blocking layer disposed between the substrate and the transistor and overlapping the transistor. The clock signal line includes a first conductive line and a second conductive line overlapping the first conductive line, and the first conductive line is disposed in the same layer as the light blocking layer.

The clock signal line may be connected to the at least one stage by a connector, and the first conductive line may be electrically connected to the second conductive line by the connector.

The second conductive line may include a cutout overlapping the first conductive line, and the connector may be connected to the first conductive line through the cutout.

The display device may further include a first insulating layer disposed between the first conductive line and the second conductive line, and a second insulating layer disposed on the first and second conductive lines. The connector may be connected to the second conductive line through a first contact hole formed in the second insulating layer, and may be connected to the first conductive line through a second contact hole formed in the first and second insulating layers.

The display device may further include an insulator disposed between the first insulating layer and the second conductive line. The insulator may have a planar shape substantially the same as that of the second conductive line.

The first conductive line may include a first opening, and the second conductive line may include a second opening overlapping the first opening.

The transistor may include a gate electrode, a source electrode, a drain electrode, and a semiconductor, and the second conductive layer may be disposed in the same layer as the gate electrode of the transistor.

The connector may be disposed in the same layer as the source electrode and the drain electrode of the transistor.

The semiconductor may be disposed between the light blocking layer and the gate electrode.

The source electrode may be electrically connected to the light blocking layer.

The display device may further include a pixel electrode connected to the transistor, wherein the connector may be disposed in the same layer as the pixel electrode.

According to another aspect of the invention, a method for manufacturing a display device includes the steps of depositing a conductive material on a substrate and patterning a deposited layer to form a light blocking layer and a first conductive line of a clock signal line, depositing an insulating material on the light blocking layer and the first conductive line to form a first insulating layer, depositing a semiconductor material on the first insulating layer and patterning the deposited semiconductor material to form a semiconductor layer overlapping the light blocking layer, depositing an insulating material on the semiconductor layer to form a second insulating layer, depositing a conductive material on the second insulating layer to form a gate conductive layer, and forming a photosensitive film pattern on the gate conductive layer, etching the gate conductive layer with the photosensitive film pattern as a mask to form a gate electrode and a second conductive line of the clock signal line, and etching the second insulating layer to form a third insulating layer and a fourth insulating layer respectively overlapping the gate electrode and the second conductive line.

The method may further include: depositing an insulating material on the gate electrode and the clock signal line to form a fifth insulating layer, and forming first and second contact holes in the first and fifth insulating layers, and depositing a conductive material to form a data conductive layer, and patterning the data conductive layer to form a source electrode connected to a source region of the semiconductor layer and the light blocking layer, a drain electrode connected to a drain region of the semiconductor, and a connector connected to the first conductive line and the second conductive line.

The step of forming the second conductive line may include forming a cutout in the second conductive line, wherein the cutout overlaps the first conductive line.

The step of forming of the first and second contact holes in the first and fifth insulating layers may include forming the first contact hole exposing the second conductive line through the fifth insulating layer, and forming the second contact hole exposing the first conductive line in a region overlapping the cutout of the second conductive line in the first and fifth insulating layers.

The step of depositing a conductive material to form the connector may include connecting the connector to the second conductive line through the first contact hole, and may include connecting the connector to the first conductive line through the second contact hole.

The method may further include, after forming the semiconductor layer, making part of the semiconductor layer serve as a conductor to form a source region and a drain region.

The step of etching the gate conductive layer with the photosensitive film pattern as a mask to form the second conductive line may include forming the second conductive line overlapping the first conductive line.

According to another aspect of the invention, a display device includes a substrate, a gate driver disposed on the substrate and including a plurality of stages, a clock signal line disposed on the substrate and transmitting a clock signal to at least one of the stages, and a transistor disposed on the substrate. The clock signal line includes a first conductive line and a second conductive line overlapping the first conductive line.

The display device may further include a light blocking layer disposed between the substrate and the transistor and overlapping the transistor, and the first conductive line may be disposed in the same layer as the light blocking layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
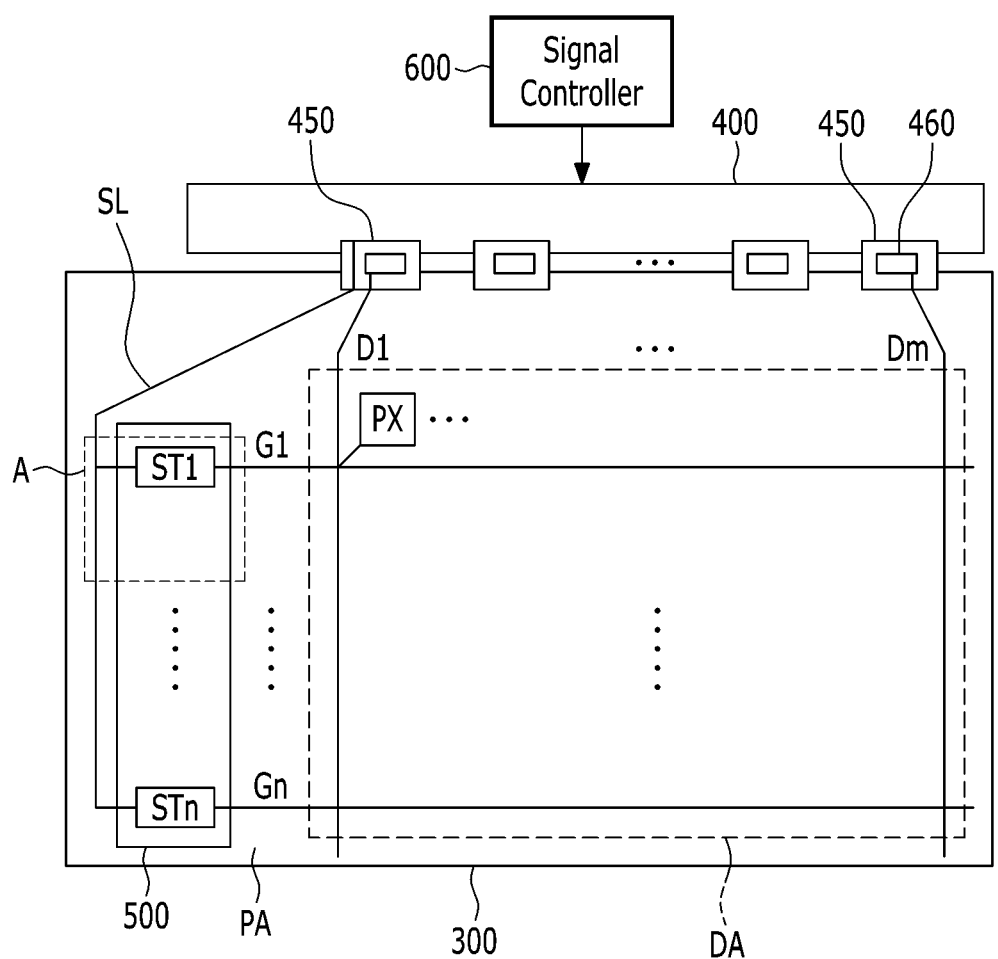
FIG. 1 is a schematic plan view of display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A display device constructed according to one or more exemplary embodiments of the invention is described in detail below with reference to accompanying drawings.

Referring to FIG. 1, the display device includes a display panel 300, a data driver 460, a gate driver 500, and a signal controller 600.

The display panel 300 includes a display area DA for displaying images, and a peripheral area PA provided around the display area DA and including the gate driver 500 for applying a gate signal to gate lines G1-Gn.

A plurality of pixels PX is disposed in a matrix formation in the display area DA. Where the display is a liquid crystal display, the pixel PX includes a thin film transistor, a liquid crystal capacitor, and a storage capacitor. The liquid crystal capacitor includes a liquid crystal layer, and it may be charged in a microcavity for each or a plurality of pixel areas. Where the display is an organic light emitting device, the pixel PX includes a switching transistor, a driving transistor, a storage capacitor, and a light-emitting device. The gate lines G1-Gn and data lines D1-Dm are disposed in the display area DA. The gate lines G1-Gn and the data lines D1-Dm are connected to the pixels PX, and they may traverse each other while they are insulated from each other.

The data driver 460 may be mounted as an integrated circuit chip on a flexible printed circuit board (FPCB) 450 attached to a pad portion of the display panel 300, and may be connected to the display panel 300. The data lines D1-Dm of the display area DA may receive a data voltage from the data driver 460. Contrary to the example shown in the drawing, the data driver 460 may be installed as an integrated circuit chip in the peripheral area PA. The data driver 460 is shown on an upper side of the display panel 300 in FIG. 1, but it may be provided on a lower side of the display panel 300.

The gate driver 500 is integrated in the peripheral area PA of the display panel 300. The gate driver 500 is provided in a left peripheral area of the display panel 300 in FIG. 1, but it may be provided in a right peripheral area or both the right and left peripheral areas.

The gate driver 500 and the data driver 460 are controlled by the signal controller 600. A printed circuit board PCB 400 may be provided outside the FPCB 450 to transmit the signals from the signal controller 600 to the data driver 460 and the gate driver 500. The signals provided to the gate driver 500 by the signal controller 600 may include signals such as a vertical start signal or a clock signal, and a signal for providing a low voltage of a specific level.

The gate driver 500 receives a vertical start signal, a clock signal, and a low voltage corresponding to the gate-off voltage, generates gate signals (a gate-on voltage and a gate-off voltage), and applies the same to the gate lines G1-Gn. The gate driver 500 includes stages (ST1-STn) for generating and outputting a gate voltage by using the above-noted signals, and signal lines SL for transmitting the signals to the stages ST1-STn.

Each of the stages ST1-STn may include transistors and at least one capacitor. The transistors and the capacitor may be formed during the process for forming the transistor included in the pixel PX of the display area DA. The gate lines G1-Gn are connected to output ends of the stage ST1-STn, and the gate lines G1-Gn receive gate signals from the stages ST1-STn.

The signal lines SL may be positioned farther away from the display area DA than are the stages ST1-STn. Although shown with a single line in FIG. 1, the signal lines SL may constitute multiple signal lines corresponding in number with the number of signals applied to the gate driver 500, or may constitute a lesser or greater number of lines than the number of signals. The signal lines SL include a plurality of clock signal lines for transmitting the clock signals.

The vertical start signal, the clock signal, and the low voltage applied to the gate driver 500 are applied to the gate driver 500 through the FPCB 450 provided near the gate driver 500. The signals may be transmitted to the FPCB 450 from the outside or the signal controller 600 through the PCB 400.

The foregoing description pertains to the configuration of the display device including the display panel 300. The following description pertains to the gate driver 500 and the clock signal line.

Figure 2:
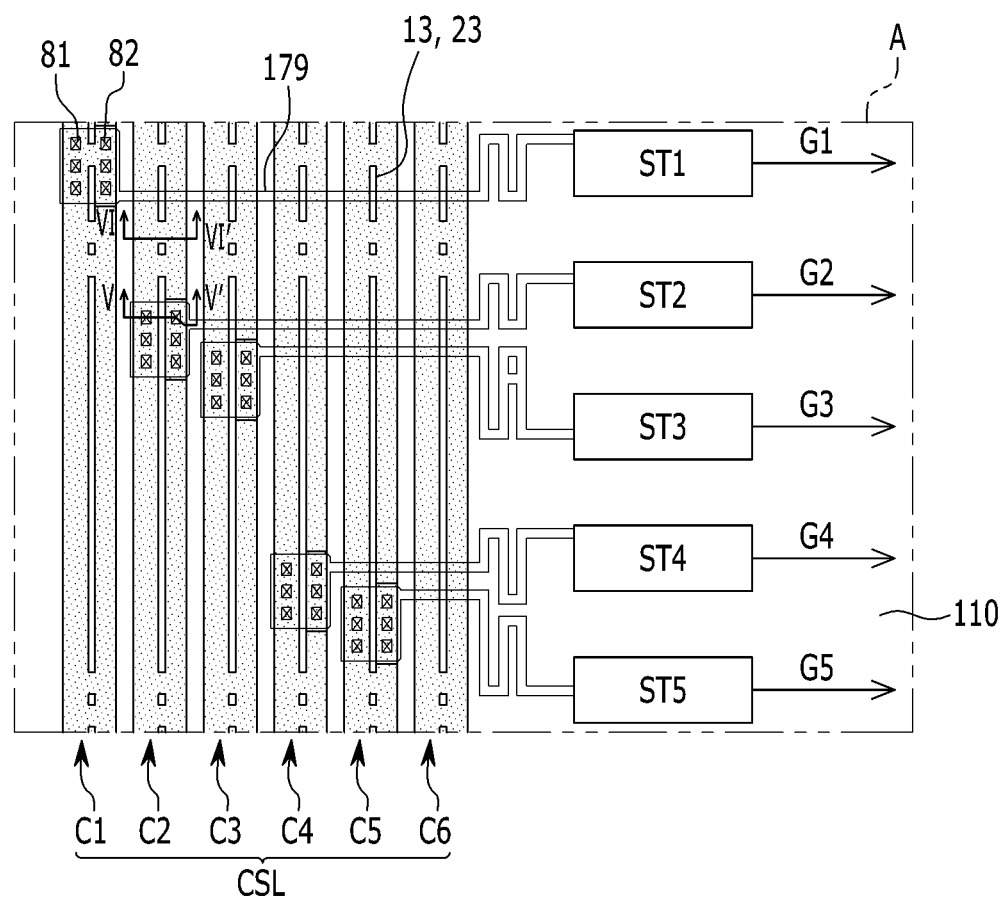
FIG. 2 is an enlarged view of a region A of FIG. 1.
Figure 3:
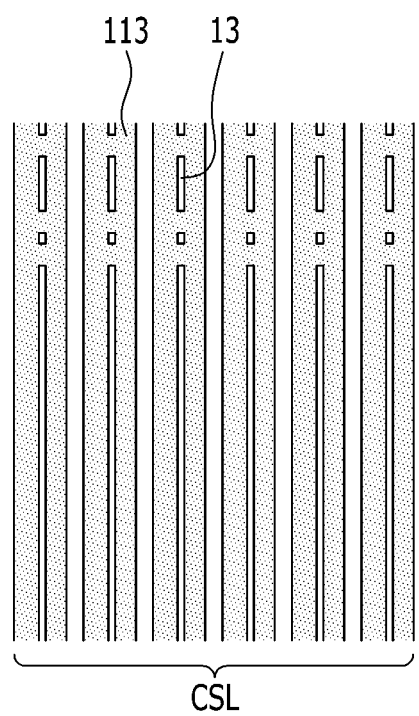
FIG. 3 is a fragmented, top plan view of a portion of a first conductive line of the clock signal line of FIG. 2.

FIG. 2 corresponds to the region A of the display panel 300 of FIG. 1, and shows the constituent elements that are formed or provided on a substrate 110. For example, the display panel 300 may include an opposing substrate facing the substrate 110, and a light blocking member may be formed on the opposing substrate.

Referring to FIG. 2 together with FIG. 1, several stages ST1-ST5 of the gate driver 500 of FIG. 1 and the clock signal lines CSL connected thereto are shown. The stages ST1-ST5 are shown simply as blocks as with FIG. 1, and the clock signal lines CSL are shown in FIG. 2 in greater detail. Some signal lines other than the clock signal lines CSL are also connected to the gate driver 500, but not shown in FIG. 2 for clarity.

The clock signal lines CSL include first to sixth clock signal lines C1-C6, which extend in parallel to each other. The first clock signal line C1 is the farthest away from the stages ST1-STn, and the sixth clock signal line C6 is the nearest to the stages ST1-STn. The direction in which the first to sixth clock signal lines C1-C6 extend may correspond to the direction (i.e., a column direction) in which the stages ST1-STn are arranged, and may correspond to the direction in which the data lines D1-Dm extend. The first to sixth clock signal lines C1-C6 may receive clock signals that are sequentially phase-delayed at a predetermined interval such as one horizontal period that may be referred to as 1H. The stages ST1-STn may be connected to the first to sixth clock signal lines C1-C6 to receive clock signals with six consecutive stages as a repetition period. The first to sixth clock signal lines C1-C6 are connected to the stages ST1-STn corresponding to connectors 179.

FIG. 2 shows six clock signal lines CSL, but the number of clock signal lines CSL may be greater or less than six. For example, the number of clock signal lines CSL may be 2, 4, 6, 8, or even more than that. The number of clock signal lines CSL may correspond to the number of clock signals in use, and the stages ST1-STn may be connected to the clock signal lines CSL with consecutive stages in a number corresponding to the number of clock signals being used as the repetition period.

Referring to FIG. 2 to FIG. 6, each clock signal line CSL has a dual layer structure in which the clock signal lines CSL overlap each other in the thickness direction of the display panel 300 with an insulating layer 111 and an insulator 143 therebetween, and are thus physically separated from each other. That is, as shown best in FIG. 5, the clock signal line CSL includes a first conductive line 113 and a second conductive line 123 overlapping the first conductive line 113. Though physically separated from the second conductive line 123, the first conductive line 113 is electrically connected to the second conductive line 123 through a connector 179. The first conductive line 113 may be electrically connected to the second conductive line 123, so they may together form a single clock signal line CSL for transmitting the same clock signal.

The first conductive line 113 includes a slit 13 provided in a longitudinal direction (the direction in which the longest dimension of the first conductive line 113 extends) along a center of the first conductive line 113. The slits 13 are not continuously provided because the first conductive line 113 would otherwise be completely separated into a right portion and a left portion with respect to the slit 13 were the slits 13 to be continuous along the length of the first conductive line 113. The second conductive line 123 similarly includes a slit 23 provided discontinuously in a longitudinal direction (the direction in which the longest dimension of the second conductive line 123 extends) along a center of the second conductive line 123. The slits 13 and 23 may totally overlap each other. From another point of view, the first and second conductive lines 113 and 123 may be described to include two semi-lines that are separated by the width of the slits 13 and 23 and extend in parallel to each other, and the two semi-lines are connected to each other at a plurality of points to limit the lengths of the slits 13 and 23.

When the display panel 300 includes an opposing substrate, the substrate 110 and the opposing substrate may be bonded by use of a sealant, and the sealant may be provided in a region overlapping the clock signal lines CSL. Laser beams may irradiate the sealant to melt or cure the sealant, and when the laser beams are irradiated under the substrate 110, some of laser beams are blocked by the clock signal lines CSL. However, the laser beams may pass through the clock signal lines CSL through the slits 13 and 23 formed in the first and second conductive lines 113 and 123 so the amount of laser beams reaching the sealant may be increased. In other embodiments, the first and second conductive lines 113 and 123 might not include the slits 13 and 23.

Figure 4:
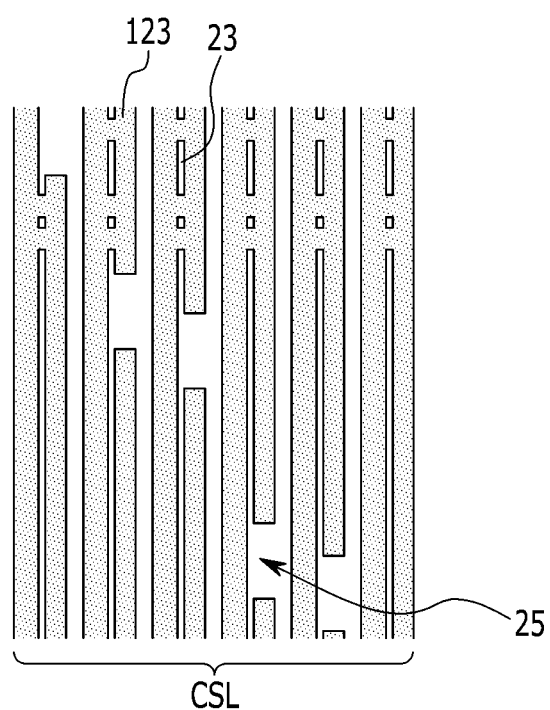
FIG. 4 is a fragmented top plan view of a portion of second conductive line of the clock signal line of FIG. 2.

The first conductive line 113 and the second conductive line 123 may totally overlap each other, and a cutout 25 is formed in the second conductive line 123 (see FIG. 4). Therefore, in a top plan view, the portion of the first conductive line 113 underneath the overlapping cutout 25 of the second conductive line 123 is not covered by the second conductive line 123, and another portion of the first conductive line 113 overlapped by the second conductive line, but not overlapped by the cutout 25, may be substantially covered by the second conductive line 123. The cutout 25 is formed to respectively connect the first conductive line 113 and the second conductive line 123, provided on different layers, to the connector 179 provided above the conductive lines 113 and 123. As illustrated, the cutout 25 may be formed such that the right portion (i.e., the right portion of the slit 23 with reference to FIG. 4) substantially to the right of the center line of the second conductive line 123 may be recessed, and contrary to the drawing, the left portion (i.e., the left portion of the slit 23 with reference to FIG. 4) substantially to the left of the center line of the second conductive line 123 may be recessed, but the position or the shape of such a formation on the second conductive line is not limited to the foregoing example. For example, the cutout 25 may be formed inside the second conductive line 123.

Figure 5:
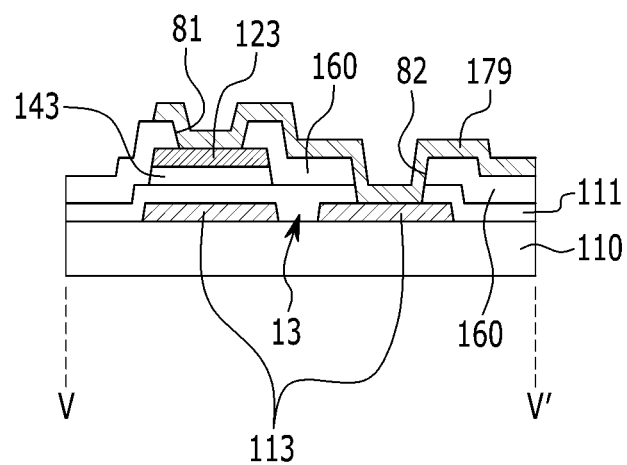
FIG. 5 is a cross-sectional view taken along line V-V' of FIG. 2 illustrating a first embodiment of a gate driver constructed according to the principles of the invention.
Figure 6:
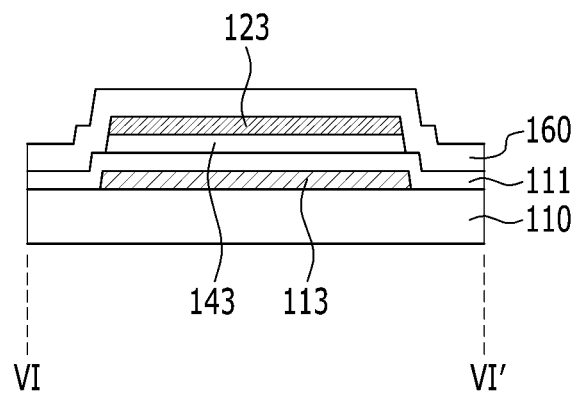
FIG. 6 is a cross-sectional view of the first embodiment of the gate driver taken along line VI-VI' of FIG. 2.

Regarding the cross-sectional configuration of the region in which the clock signal line CSL is provided, with particular reference to FIG. 5 and FIG. 6, the first conductive line 113 of the clock signal line CSL is provided on the substrate 110, which may be made of an insulating material such as glass or plastic. A first insulating layer 111 is provided on the first conductive line 113, and an insulator 143 and a second conductive line 123 are provided on the first insulating layer 111. The second conductive line 123 has substantially the same planar shape as the insulator 143. Substantially the same planar shape means, in a top plan view, regions occupied by two constituent elements corresponding to each other, have substantially parallel edges at a regular interval. When the two constituent elements have substantially the same planar shape, it may be because they are formed by using one mask.

A second insulating layer 160 is provided on the first insulating layer 111 and the second conductive line 123. A first contact hole 81 is formed in a region overlapping the second conductive line 123 on the second insulating layer 160. A second contact hole 82 is formed in a region overlapping the first conductive line 113 and the cutout 25 on the first and second insulating layers 111 and 160. A connector 179 is provided on the second insulating layer 160. The connector 179 is connected to the second conductive line 123 through the first contact hole 81, and is connected to the first conductive line 113 through the second contact hole 82. Accordingly, the second conductive line 123 is electrically connected to the first conductive line 113. The connector 179 is connected to one (e.g., the second stage ST2 in FIG. 2) of the stages ST1-STn. The connector 179 extends in substantially the same direction as the direction in which the gate lines G1-Gn extend. However, to compensate for a difference in resistance caused by the distance between the clock signal lines CSL and the stages ST1-STn, a bent portion (e.g., a portion between the clock signal line C6 and the stages ST1-STn) may be included so that the lengths of the connectors 179 connected to different clock signal lines may be substantially the same.

Figure 7:
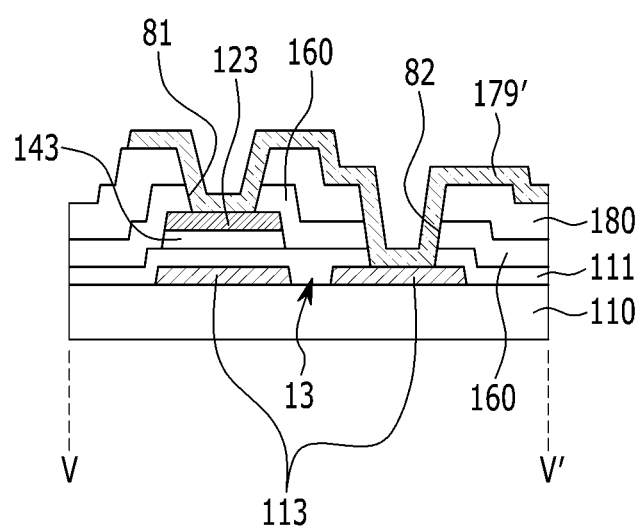
FIG. 7 is a cross-sectional view taken along line of V-V' of FIG. 2 illustrating a second embodiment of a gate driver constructed according to the principles of the invention.

Referring to the second embodiment of the gate driver shown in FIG. 7, the first conductive line 113 and the second conductive line 123 of the clock signal line CSL correspond to the embodiment of FIG. 5 except for the connector 179'. That is, the first conductive line 113 is provided on the substrate 110 and the first insulating layer 111 is provided thereon, and the insulator 143 and the second conductive line 123 are provided on the first insulating layer 111. The second insulating layer 160 is provided on the second conductive line 123, and a third insulating layer 180 is provided on the second insulating layer 160. The first contact hole 81 is formed in a region overlapping the second conductive line 123 on the second and third insulating layers 160 and 180, and the second contact hole 82 is formed in a region overlapping the first conductive line 113 and the cutout 25 on the first, second, and third insulating layers 111, 160, and 180. The connector 179' provided on the third insulating layer 180 is connected to the second conductive line 123 through the first contact hole 81 and is connected to the first conductive line 113 through the second contact hole 82.

When compared to the first exemplary embodiment of FIG. 5, the second exemplary embodiment of FIG. 7 further forms the third insulating layer 180 between the second insulating layer 160 and the connector 179'. In the first exemplary embodiment of FIG. 5, the connector 179 may be made of a metal, and in the second exemplary embodiment of FIG. 7, the connector 179' may be made of a transparent conductive oxide such as an indium tin oxide (ITO) or an indium zinc oxide (IZO).

By forming the clock signal lines CSL as double layers according to the above-described exemplary embodiments, the resistance of the clock signal lines CSL may be reduced and the RC delay of the clock signals may be resultantly reduced. For example, the delay of clock signals on the liquid crystal panel may decrease the charging rate of pixels. The delay of clock signals becomes a main factor in decreasing the charging rate as the resolution or size of the liquid crystal panel becomes bigger. When the charging rate decreases, defects of the image quality such as color mixing or crosstalk may occur. The margin of the charging rate may be improved by reducing the delay of clock signals through the reduction of resistance of clock signal lines CSL according to the principles of the invention. As the margin of the charging rate increases, widths of the data lines or the gate lines of the pixel area may be reduced thereby improving transmittance. The width of the clock signal line CSL may be reduced while maintaining or reducing the resistance of the clock signal line CSL according to the dual layer structure, so the peripheral area PA of the display panel 300 occupied by the clock signal line may be reduced in addition to a reduction of the RC delay, thereby reducing the width of a bezel of the display device.

The formation of double-layer wiring—with the conductor provided between the substrate 110 and the first insulating layer 111 and the conductor also provided between the first insulating layer 111 and the second insulating layer 160—may be applied to other signal lines (e.g., signal lines SL extending from a pad of the display panel 300) as well as the clock signal line CSL.

The double-layered structure of the clock signal line CSL may be formed together in the process for forming a transistor on the display panel 300. Therefore, no additional processing stage or addition of masks is needed when the display panel 300 is manufactured with the clock signal line CSL having a double-layered structure according to the principles of the invention. The reason for this is clearly apparent from the description below with reference to FIG. 8 to FIG. 15.

The stacked structure of a transistor included in the display panel is described with reference to FIG. 8, and the stacked relationship between the transistor and the above-noted clock signal line CSL is described.

Figure 8:
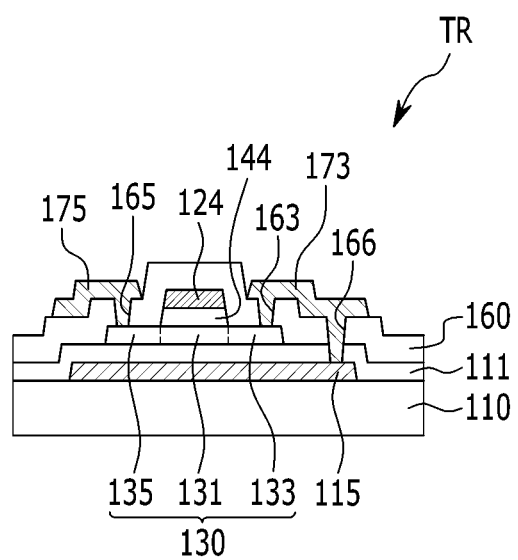
FIG. 8 is a cross-sectional view of a transistor of a gate driver constructed according to the principles of the invention.

Referring to FIG. 8, the stacked structure of the transistor TR to be included in the gate driver 500 is shown. The transistor TR with the illustrated structure may also be included in each pixel.

The transistor TR includes a semiconductor 130, a gate electrode 124, a source electrode 173, and a drain electrode 175. The source region 133 and the drain region 135 may be determined by the direction of carriers flowing through the channel region 131 of the semiconductor 130 when a gate-on voltage is applied to the gate electrode 124, and the carriers flow to the drain electrode 175 from the source electrode 173. Therefore, when the transistor TR is operated, electrons flow to the drain electrode 175 from the source electrode 173 in the n-type transistor, and holes flow to the drain electrode 175 from the source electrode 173 in the p-type transistor.

A light blocking layer 115 is provided on the substrate 110 including an insulating material such as glass or plastic. The light blocking layer 115 may be made of a conductive material such as a metal, and it may be made of a single layer or multilayers. The light blocking layer 115 prevents external light from reaching the semiconductor 130 to prevent characteristic deterioration (or degradation) of the semiconductor 130 and control leakage current of the transistor TR. The light blocking layer 115 includes a portion that overlaps the semiconductor 130 and a portion that does not overlap the semiconductor 130. Referring to FIG. 5 to FIG. 7, the first conductive line 113 of the clock signal line CSL may be provided on the same layer as the light blocking layer 115, and may be made of the same material thereof.

A first insulating layer 111 is provided between the substrate 110 and the semiconductor 130 on the light blocking layer 115. The first insulating layer 111 may prevent impurities from the substrate 110 from reaching the semiconductor 130 to protect the semiconductor 130 and improve the performance characteristics of the semiconductor 130, and thus the first insulating layer 111 may therefore be referred to as a buffer layer. The first insulating layer 111 may include an inorganic insulating material such as a silicon oxide (SiOx), a silicon nitride (SiNx), aluminum oxide ($Al_2O_3$), hafnium oxide ($HfO_3$), or yttrium oxide ($Y_2O_3$). The first insulating layer 111 may be a single layer or multiple layers. For example, when the first insulating layer 111 has two layers, a lower layer may include a silicon nitride (SiNx) and an upper layer may include a silicon oxide (SiOx). Referring to FIG. 5 to FIG. 7, the first insulating layer 111 is also provided on the first conductive line 113.

A semiconductor 130 is provided on the first insulating layer 111. The semiconductor 130 includes a source region 133, a drain region 135, and a channel region 131 therebetween. The semiconductor 130 may include an oxide semiconductor. The oxide semiconductor may include an oxide of a metal such as zinc (Zn), indium (In), gallium (Ga), tin (Sn), or titanium (Ti), or a combination of a metal such as zinc (Zn), indium (In), gallium (Ga), tin (Sn), or titanium (Ti) and an oxide thereof. For example, the oxide semiconductor may include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), or an indium-zinc-tin oxide (IZTO). The source region 133 and the drain region 135 may include a material de-oxidized from the oxide semiconductor material included in the channel region 131 of the transistor TR. The source region 133 and the drain region 135 may be formed by making the oxide semiconductor forming the semiconductor 130 serve as a conductor according to a plasma processing method. The semiconductor 130 may include a semiconductor material such as polysilicon.

An insulator 144 is provided on the semiconductor 130. The insulator 144 may be a single layer or a multilayer structure. When the insulator 144 is s single layer, it may include an insulating material such as a silicon oxide (SiOx), a silicon nitride (SiNx), a silicon oxynitride (SiON), aluminum oxide ($Al_2O_3$), hafnium oxide ($HfO_3$), or yttrium oxide ($Y_2O_3$). When the insulator 144 is a multilayer structure, a lower layer contacting the semiconductor 130 may include an insulating oxide such as a silicon oxide (SiOx), an aluminum oxide ($Al_2O_3$), hafnium oxide ($HfO_3$), or yttrium oxide ($Y_2O_3$) to improve an interface characteristic of the channel region 131 and prevent the impurity from being input to the channel region 131, and at least one layer provided thereon may include various kinds of insulating materials such as a silicon nitride (SiNx) or a silicon oxide (SiOx). Referring to FIG. 5 to FIG. 7, the insulator 143 that may be formed on the same layer as the insulator 144 with the same material provided on the first insulating layer 111.

A gate electrode 124 is provided on the insulator 144. For example, the gate electrode 124 may include a metal such as copper (Cu), aluminum (Al), silver (Ag), molybdenum (Mo), chromium (Cr), tantalum (Ta), or titanium (Ti). The gate electrode 124 may be a single layer or may be a multilayer structure made of different materials. The gate electrode 124 has substantially the same planar shape as the insulator 144. The gate electrode 124 overlaps the channel region 131 with an insulator 144 therebetween. The planar shape of the channel region 131 may be substantially the same as the shape of the insulator 144. Referring to FIG. 5 to FIG. 7, a second conductive line 123 is provided on the insulator 143. The second conductive line 123 may be provided on the same layer as the gate electrode 124 with a same material. Thus, the second conductive line 123 may be formed in the same manufacturing step as the gate electrode 124 using a single mask.

A second insulating layer 160 is provided on the gate electrode 124. The second insulating layer 160 is also referred to as an intermediate insulating layer. The second insulating layer 160 may include an inorganic insulating material such as a silicon oxide (SiOx), a silicon nitride (SiNx), a silicon oxynitride (SiON), or a silicon oxyfluoride (SiOF). The second insulating layer 160 may be a single layer or a multilayer structure. When the second insulating layer 160 is a single layer, the second insulating layer 160 may include an inorganic insulating material such as a silicon oxide (SiOx), a silicon nitride (SiNx), silicon oxynitride (SiON), or a silicon oxyfluoride (SiOF). When the second insulating layer 160 includes a silicon nitride (SiNx) and/or a silicon oxynitride (SiON), resistance of the source region 133 and the drain region 135 may be reduced by supplying hydrogen (H) to the source region 133 and the drain region 135. When the second insulating layer 160 is a multilayer structure, the lowest layer may include a silicon nitride (SiNx) and/or a silicon oxynitride (SiON) for supplying hydrogen (H) to the source region 133 and the drain region 135, a layer including, for example, a silicon oxide (SiOx) may be provided on the lowest layer, and a layer including a silicon nitride (SiNx) and/or a silicon oxynitride (SiON) may be additionally provided thereon.

The second insulating layer 160 may include a contact hole 163 for exposing the source region 133 and a contact hole 165 for exposing the drain region 135. The second insulating layer 160 and the first insulating layer 111 may include a contact hole 166 for exposing the light blocking layer 115. At least one of the contact holes 163, 165, and 166 may be omitted depending on the type of the transistor TR.

A source electrode 173 and a drain electrode 175 are provided on the second insulating layer 160. The drain electrode 175 is connected to the drain region 135 through the contact hole 165. The source electrode 173 is connected to the source region 133 through the contact hole 163 and is connected to the light blocking layer 115 through the contact hole 166. Since the light blocking layer 115 overlapping the semiconductor 130 with the first insulating layer 111 therebetween is connected to the source electrode 173, a source voltage that is a voltage at the source electrode 173 may be applied to the light blocking layer 115. When the source voltage is applied to the light blocking layer 115 as described, a current variation (slope) is less in a saturation region of a voltage-current characteristic graph of the transistor TR, thereby improving an output saturation characteristic of the transistor TR.

The source electrode 173 and the drain electrode 175 may be made of a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), or nickel (Ni). The source electrode 173 and the drain electrode 175 may respectively be a single layer or a multilayer structure. Referring to FIG. 5, a connector 179 connected to the second conductive line 123 through the first contact hole 81 and connected to the first conductive line 113 through the second contact hole 82 is provided on the second insulating layer 160. The connector 179 may be provided on the same layer as the source electrode 173 and the drain electrode 175 with the same material.

FIG. 9 to FIG. 15 are cross-sectional views of sequential steps in a method for manufacturing the display device described above. In the respective drawings, the left portion, having sectional line V-V', represents the region of the clock signal line CSL corresponding to FIG. 5, and the right portion indicates the region of the transistor TR corresponding to FIG. 8.

Figure 9:
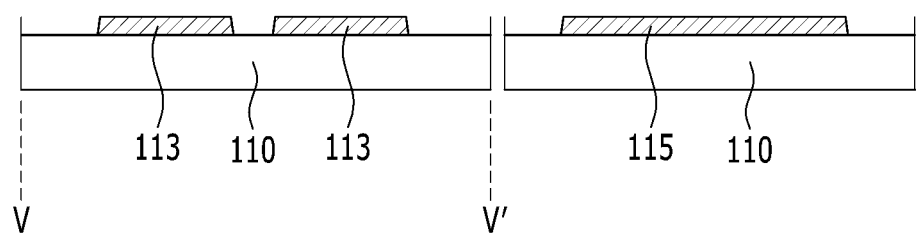
FIG. 9 to FIG. 15 are fragmented, cross-sectional views of sequential stages in the steps of an exemplary method for manufacturing a display device according to the principles of the invention.

Referring to FIG. 9, a conductive material such as a metal is deposited on the substrate 110 through sputtering, and it is patterned by using a photosensitive material such as photoresist and a first mask to thus form a first conductive line 113 in the region of the clock signal line CSL and a light blocking layer 115 in the region of the transistor TR.

Figure 10:
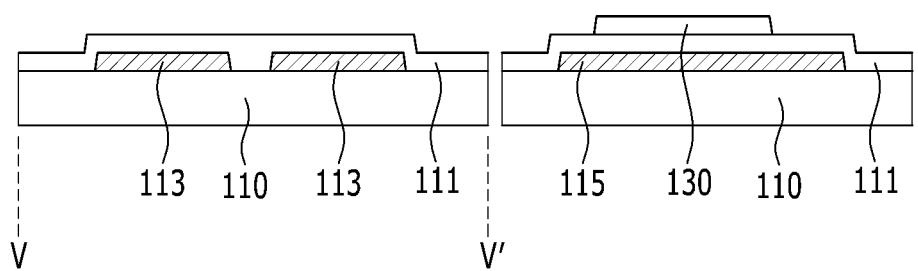

Referring to FIG. 10, a first insulating layer 111 is formed by depositing inorganic insulating materials such as a silicon oxide (SiOx), a silicon nitride (SiNx), aluminum oxide ($Al_2O_3$), hafnium oxide ($HfO_3$), or yttrium oxide ($Y_2O_3$) on the substrate 110 on which the first conductive line 113 and the light blocking layer 115 are formed through chemical vapor deposition (CVD). As noted above, the first insulating layer 111 also is referred to herein as a buffer layer.

An oxide semiconductor material such as a zinc oxide (ZnO), a zinc-tin oxide (ZTO), a zinc-indium oxide (ZIO), an indium oxide (InO), a titanium oxide (TiO), an indium-gallium-zinc oxide (IGZO), or an indium-zinc-tin oxide (IZTO) is deposited on the first insulating layer 111 through chemical vapor deposition, and they are patterned by using a second mask, thereby forming a semiconductor 130.

Figure 11:
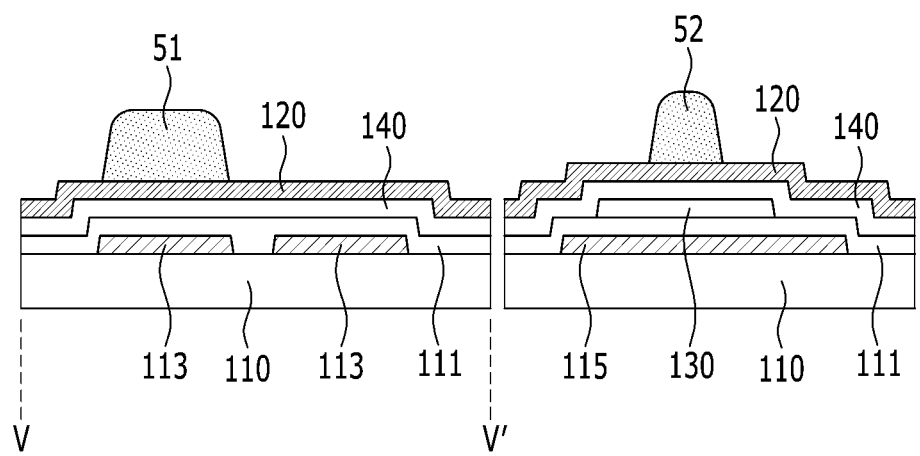

Referring to FIG. 11, a gate insulating layer 140 is formed by depositing inorganic insulating materials such as a silicon oxide (SiOx), a silicon nitride (SiNx), or a silicon oxynitride (SiON) on the substrate 110 on which the semiconductor 130 is formed through chemical vapor deposition. A gate conductive layer 120 is formed on the gate insulating layer 140 by depositing a conductive material such as a metal through sputtering. A photosensitive material is deposited on the gate conductive layer 120 and a third mask is used to form photosensitive film patterns 51 and 52.

Figure 12:
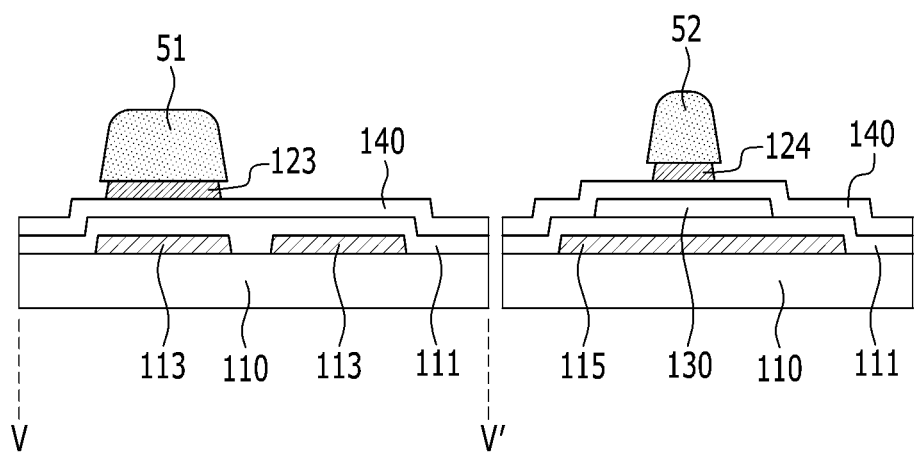

Referring to FIG. 12, the gate conductive layer 120 is etched with the photosensitive film pattern 51 and 52 as a mask to form a second conductive line 123 of the clock signal line CSL and a gate electrode 124 of the transistor TR. In this instance, the gate conductive layer 120 may be etched by wet etching or dry etching.

Figure 13:
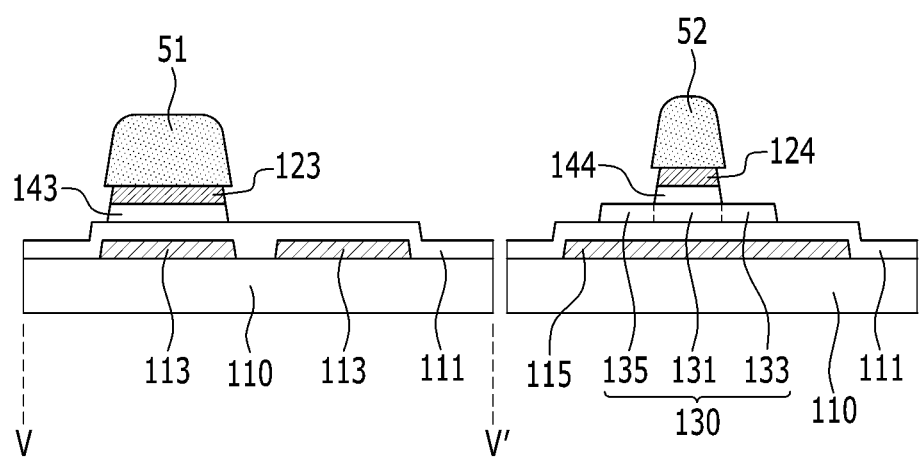

Referring to FIG. 13, the gate insulating layer 140 is etched with the photosensitive film patterns 51 and 52 as a mask to form insulators 143 and 144. Here, the gate insulating layer 140 may be etched through dry etching. In this process, an etching gas such as SF6 may be doped to the exposed semiconductor 130 not covered by the photosensitive film patterns 51 and 52 and the insulator 144 so resistance of the exposed portion of the semiconductor 130 may be reduced. Accordingly, the semiconductor layer portion covered by the insulator 144 remains as a channel region 131 and the remaining portion has conductivity to thus form the source region 133 and the drain region 135. However, when the gate insulating layer 140 is patterned, most of the semiconductor 130 may maintain the characteristic of being a semiconductor. The second conductive line 123 and the gate electrode 124 are etched by using the same photosensitive film patterns 51 and 52, and the insulators 143 and 144 are also etched, so the second conductive line 123 and the insulator 143 may have substantially the same planar shape, and the gate electrode 124 and the insulator 144 may have the same planar shape.

The semiconductor 130 that is not covered by the insulator 144 and is exposed is thereby additionally processed to form the source region 133 and the drain region 135. The processing method in this instance may include a heat treatment method in a reduction atmosphere, and a plasma processing method using gas plasma such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen ($N_2$), nitrogen oxide ($N_2O$), or fluoroform ($CHF_3$). The semiconductor layer 130 covered by the insulator 144 mostly maintains the characteristic of being a semiconductor to thus become the channel region 131.

Figure 14:
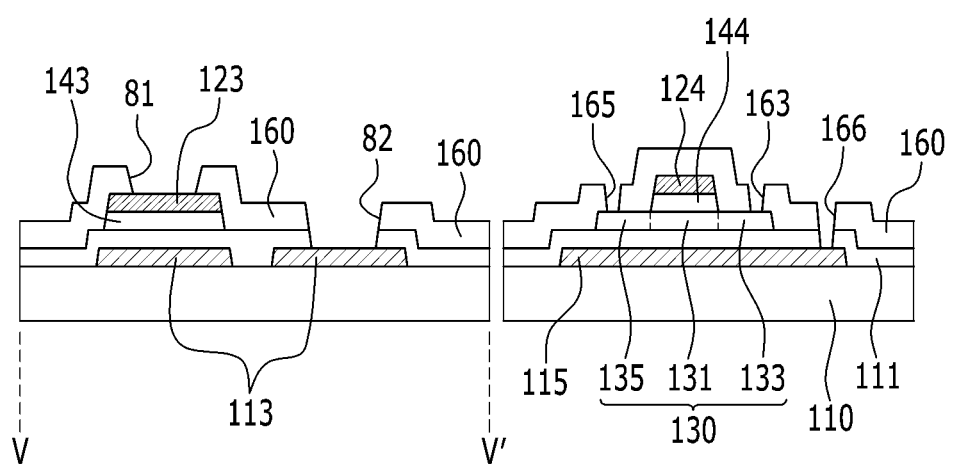

Referring to FIG. 14, inorganic insulating materials such as a silicon oxide (SiOx), a silicon nitride (SiNx), and a silicon oxynitride (SiON) are deposited on the substrate 110 on which the gate electrode 124 is formed through chemical vapor deposition to form a second insulating layer 160 with a single-layered or multilayered structure. A component such as hydrogen—included in a gas compound such as $SiH_4$ or $NH_3$ used for a process for film-forming the second insulating layer 160—is doped to the semiconductor 130 or the source region 133 and drain region 135 that are conductive so that a portion except the channel region 131 may have low resistance. After the second insulating layer 160 is film-formed, the component such as hydrogen included by the second insulating layer 160 may be spread to the source region 133 and the drain region 135 to have low resistance.

The second insulating layer 160 is patterned by using a fourth mask to form a contact hole 82 for exposing the first conductive line 113, a contact hole 163 for exposing the source region 133, a contact hole 165 for exposing the drain region 135, and a contact hole 166 for exposing the light blocking layer 115. During the same patterning process using a fourth mask, a contact hole 82 for exposing the first conductive line 113 together with the contact hole 82 formed in the second insulating layer 160 and a contact hole 166 for exposing the light blocking layer 115 together with the contact hole 166 formed in the second insulating layer are formed in the first insulating layer 111. At least one of the contact holes 163, 165, and 166 might not be formed depending on the type of the transistor.

Figure 15:
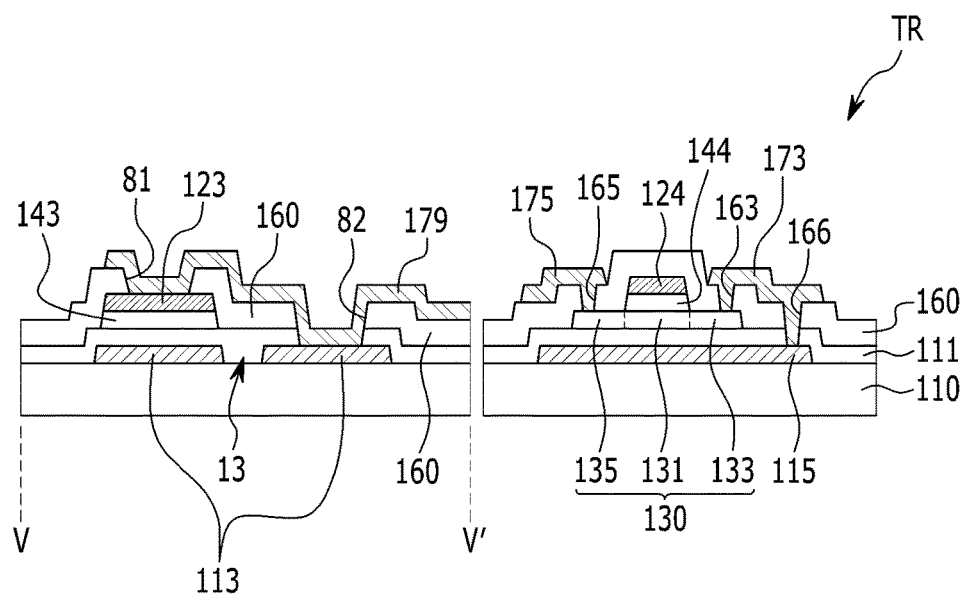

Referring to FIG. 15 for the resulting structure, a conductive material such as a metal is then deposited on the second insulating layer 160 through sputtering, and is patterned by use of a fifth mask to form a plurality of data conductors including a connector 179, a source electrode 173, and a drain electrode 175. In this instance, the first conductive line 113 is electrically connected to the second conductive line 123 by the connector 179, and the light blocking layer 115 is electrically connected to the source region 133 by the source electrode 173.

As described, the conductive lines 113 and 123 of the clock signal line CSL and the contact holes 81 and 82 and the connector 179 for connecting the conductive lines 113 and 123 through the contact holes 81 and 82 may be formed together with the transistor TR by using the same masks that are used in forming the transistor TR. Therefore, there is no need to add a mask or any additional process step in order to form the dual layer structure of the clock signal line CSL described herein.

A pixel area of a display device is described below.

The exemplary display device described below is a liquid crystal display, and repeated description of the above-noted constituent elements will be simplified or omitted below to avoid redundancy.

Figure 16:
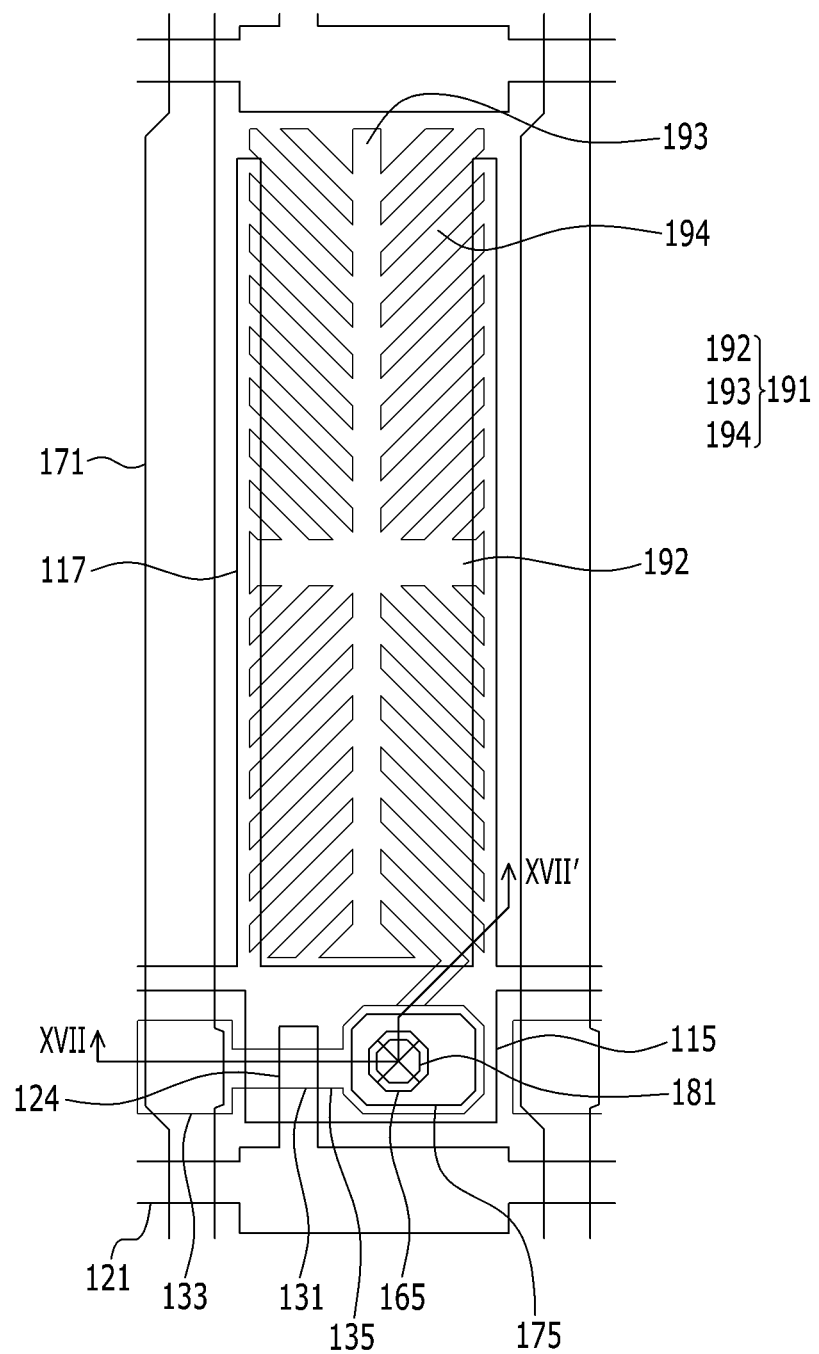
FIG. 16 is a fragmented, schematic plan view of a pixel area of a display device constructed according to the principles of the invention.
Figure 17:
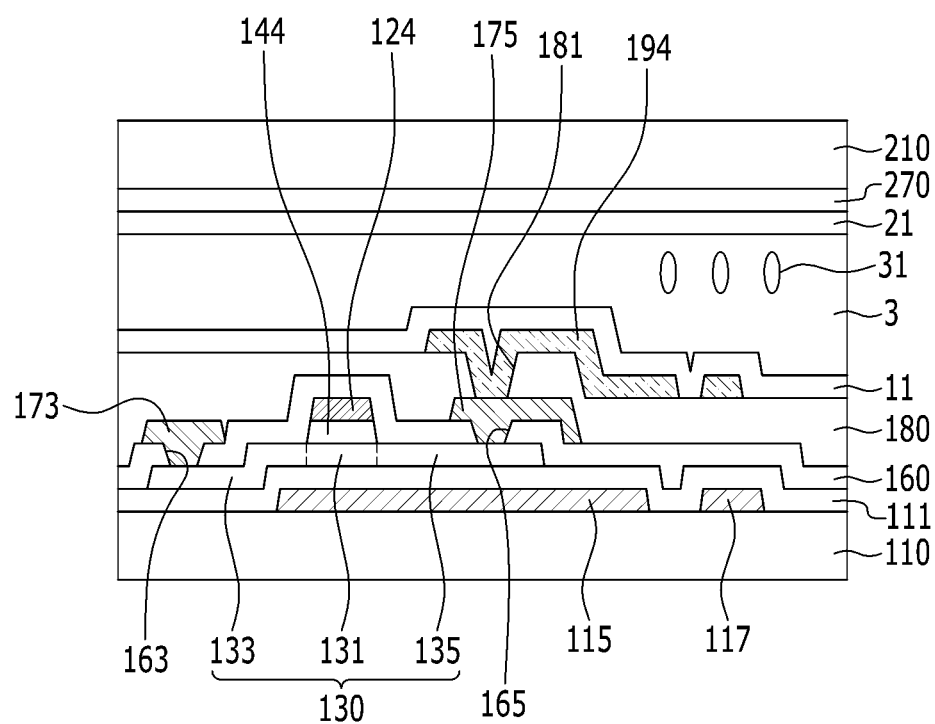
FIG. 17 is a cross-sectional view of the pixel area taken along line XVII-XVII' of FIG. 16.

FIG. 16 shows one of a plurality of pixel areas, and the pixel areas are arranged from top to bottom and from left to right on the liquid crystal panel. Referring to FIG. 16 and FIG. 17, a light blocking layer 115 and a storage electrode line 117 are provided on the substrate 110. The storage electrode line 117 may extend in a row direction to traverse the pixel area, and may extend in a column direction to overlap the pixel electrode 191. The storage electrode line 117 receives a predetermined voltage such as a common voltage. The storage electrode line 117 is connected to the light blocking layer 115. Therefore, the source electrode 173 of the transistor in the pixel area is not connected to the light blocking layer 115, in contrast to the transistor of the gate driver in that regard. Alternatively, the light blocking layer 115 might not be connected to the storage electrode line 117, but might be connected to the source electrode 173 or might not be connected to either one of the storage electrode line 117 or the source electrode 173. The storage electrode line 117 may be provided on a different layer (e.g., the same layer as the gate line 121) from the light blocking layer 115.

A first insulating layer 111 is provided on the light blocking layer 115 and the storage electrode line 117, and a semiconductor 130 including a channel region 131, a source region 133, and a drain region 135 is provided thereon.

An insulator 144 and a gate electrode 124 are provided on the semiconductor 130, and a gate line 121 connected to the gate electrode 124 is provided on the first insulating layer 111. The gate line 121 may be formed on the same layer as the gate electrode 124 with the same material. The gate line 121 may generally extend in the row direction. An insulator having substantially the same planar shape as the gate line 121 may be provided between the gate line 121 and the first insulating layer 111.

A second insulating layer 160 is provided on the gate electrode 124 and the gate line 121, and a source electrode 173 and a drain electrode 175 respectively connected to the source region 133 and the drain region 135 through the contact holes 163 and 165 formed in the second insulating layer 160 are provided on the second insulating layer 160. A data line 171 mainly extending in the column direction is provided on the second insulating layer 160, and the source electrode 173 may be a part of the data line 171 overlapping the source region 133.

A third insulating layer 180 is provided on the source electrode 173, the drain electrode 175, and the data line 171. The third insulating layer 180 may include an organic insulating material and/or an inorganic insulating material, and may be a single layer or a multilayer structure. An upper side of the third insulating layer 180 may be substantially flat.

A pixel electrode 191 including a horizontal stem 192, a vertical stem 193, and a fine branch 194 is provided on the third insulating layer 180. The pixel electrode 191 is connected to the drain electrode 175 through a contact hole 181 provided in the third insulating layer 180. The pixel electrode 191 may be made of a transparent conductive material such as an ITO or an IZO. Referring to FIG. 7, a connector 179' provided on the third insulating layer 180 and connecting the first and second conductive lines 113 and 123 may be provided on the same layer as the pixel electrode 191 with the same material.

When the transistor is turned on by a gate-on voltage applied through the gate line 121, the pixel electrode 191 receives the data voltage applied through the data line 171, and the pixel is charged with the data voltage. According to the principles of the invention, the length of the charging time may be decreased as the resistance of the clock signal line CSL is reduced to thus respond faster to high resolution, faster driving of the display, and the size of the display panel, the width of the data line 171 and/or the gate line 121 may be reduced to thereby improve transmittance.

An insulating layer 210 is provided on the pixel electrode 191 with a liquid crystal layer 3 including liquid crystal 31 therebetween. The insulating layer 210 may be a substrate.

A common electrode 270 for generating an electric field to the liquid crystal layer 3 together with the pixel electrode 191 and controlling an arranged direction of the liquid crystal 31 may be provided over or below the insulating layer 210. The common electrode 270 may be provided between the substrate 110 and the liquid crystal layer 3. The common electrode 270 may be made of a transparent conductive material such as an ITO or an IZO.

Alignment layers 11 and 21 are provided between the pixel electrode 191 and the liquid crystal layer 3 and between the common electrode 270 and the liquid crystal layer 3. The alignment layers 11 and 21 may control initial alignment of the liquid crystal 31 when the electric field is not generated to the liquid crystal layer 3.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
   a substrate;
   a gate driver disposed on the substrate and including a plurality of stages;
   a clock signal line disposed on the substrate and transmitting a clock signal to at least one of the stages;
   a transistor disposed on the substrate; and
   a light blocking layer disposed between the substrate and the transistor and overlapping the transistor
   wherein the clock signal line includes a first conductive line and a second conductive line overlapping the first conductive line, and
   the first conductive line is disposed in the same layer as the light blocking layer.

2. The display device of claim 1, wherein
   the clock signal line is connected to the at least one stage by a connector, and
   the first conductive line is electrically connected to the second conductive line by the connector.

3. The display device of claim 2, wherein
   the second conductive line includes a cutout overlapping the first conductive line, and
   the connector is connected to the first conductive line through the cutout.

4. The display device of claim 3, further comprising:
   a first insulating layer disposed between the first conductive line and the second conductive line; and a second insulating layer disposed on the first and second conductive lines, wherein the connector is connected to the second conductive line through a first contact hole formed in the second insulating layer and is connected to the first conductive line through a second contact hole formed in the first and second insulating layers.

5. The display device of claim 4, further comprising an insulator disposed between the first insulating layer and the second conductive line and having a planar shape substantially the same as that of the second conductive line.

6. The display device of claim 1, wherein the first conductive line includes a first opening, and the second conductive line includes a second opening overlapping the first opening.

7. The display device of claim 2, wherein the transistor includes a gate electrode, a source electrode, a drain electrode, and a semiconductor, and the second conductive line is disposed in the same layer as the gate electrode of the transistor.

8. The display device of claim 7, wherein the connector is disposed in the same layer as the source electrode and the drain electrode of the transistor.

9. The display device of claim 7, wherein the semiconductor is disposed between the light blocking layer and the gate electrode.

10. The display device of claim 7, wherein the source electrode is electrically connected to the light blocking layer.

11. The display device of claim 2, further comprising a pixel electrode connected to the transistor, wherein the connector is disposed in the same layer as the pixel electrode.

* * * * *